(12) United States Patent
Choi (10) Patent No.: US 8,110,341 B2
(45) Date of Patent: Feb. 7, 2012

(54) METHOD FOR MANUFACTURING A SEMICONDUCTOR DEVICE BY USING FIRST AND SECOND EXPOSURE MASKS

(75) Inventor: Jae Seung Choi, Icheon-si (KR)

(73) Assignee: Hynix Semiconductor, Inc., Icheon (KR)

( * ) Notice: Subject to any disclaimer, the term of this patent is extended or adjusted under 35 U.S.C. 154(b) by 120 days.

(21) Appl. No.: 12/495,591

(22) Filed: Jun. 30, 2009

(65) Prior Publication Data

US 2010/0209825 A1    Aug. 19, 2010

(30) Foreign Application Priority Data

Feb. 17, 2009    (KR) .................... 10-2009-0013004

(51) Int. Cl.
*G03F 7/20* (2006.01)
*G03F 7/16* (2006.01)
*G03F 7/36* (2006.01)

(52) U.S. Cl. ........................................ 430/312; 430/313

(58) Field of Classification Search .................. 430/312, 430/313
See application file for complete search history.

(56) References Cited

U.S. PATENT DOCUMENTS

| 2002/0168590 A1* | 11/2002 | Hwang et al. ................. 430/313 |
| 2003/0157436 A1* | 8/2003 | Manger et al. ................ 430/311 |
| 2009/0170035 A1* | 7/2009 | Lee et al. ..................... 430/314 |

FOREIGN PATENT DOCUMENTS

| JP | 2004-296648 | 10/2004 |
| KR | 1020070044185 A | 4/2007 |
| KR | 1020100006012 A | 1/2010 |

\* cited by examiner

*Primary Examiner* — Mark F Huff
*Assistant Examiner* — John S Ruggles (57) ABSTRACT

A method is disclosed for manufacturing a semiconductor device. The method includes: forming a substrate including a cell region and an outside region, wherein the outside region is adjacent to the cell region; forming a line-shaped pattern over the substrate using a first exposure mask so that the line-shaped spacer pattern extends from the cell region to the outside region; and patterning the line-shaped pattern in the cell region into a bar pattern while removing the line-shaped pattern in the outside region using a second exposure mask, wherein the line-shaped pattern can be formed using a spacer patterning technology (SPT) or a double pattern technology (DPT).

7 Claims, 9 Drawing Sheets

METHOD FOR MANUFACTURING A SEMICONDUCTOR DEVICE BY USING FIRST AND SECOND EXPOSURE MASKS

CROSS-REFERENCE TO RELATED APPLICATION

The priority of Korean patent application No. 10-2009-0013004, filed on Feb. 17, 2009, the disclosure of which is hereby incorporated in its entirety by reference, is claimed.

BACKGROUND OF THE INVENTION

The present invention relates to an exposure mask and a method for forming a semiconductor device by using the same, and more particularly, to an exposure mask used for a highly integrated semiconductor device and a method for forming a semiconductor device by using the same.

As a semiconductor technology advances, the size of a unit cell, for example, the size of a transistor becomes smaller and the degree of integration is sharply increased. The reduction of chip size is very important for high integration.

Particularly, in the field of DRAM (Dynamic Random Access Memory), significant chip size reduction was made. It was made by changing a cell structure or changing the layout of an active region.

Currently, the layout of a general active region is an 8F2 structure. Under this structure, the size of a unit cell is reduced by changing the arrangement of an active region with keeping 8F2 layout. For a 8F2 layout DRAM cell employing a folded bit line cell structure, one bit line reads data of a cell transistor through one sense amplifier (SA) by selecting one word line between two word lines.

Under an 8F2 layout, an active region is formed over 3F. Thus, overlay margin is generous, but it becomes hard to reduce unit cell area for higher integration.

Under a 6F2 layout employing an open bit line cell structure, adjacent two bit lines turn on to select one word line. The adjacent two bit lines are sensed by sense amplifiers which belong to different blocks to be read out.

When a DRAM cell is changed from an 8F2 structure into a 6F2 structure, the unit cell size reduces, the unit chip size reduces, and thus productivity increases. However, under a 6F2 structure, the design rule shrinks significantly, and thus the distance between active regions becomes short.

Therefore, according to a conventional exposure mask and a method for forming a semiconductor device using the exposure mask, it is required that an assist pattern (cell edge AF (Assist feature)) is formed on a cell edge area, and optical proximity correction (OPC) should be performed to prevent pattern distortion due to a smaller design rule.

Figure 1:
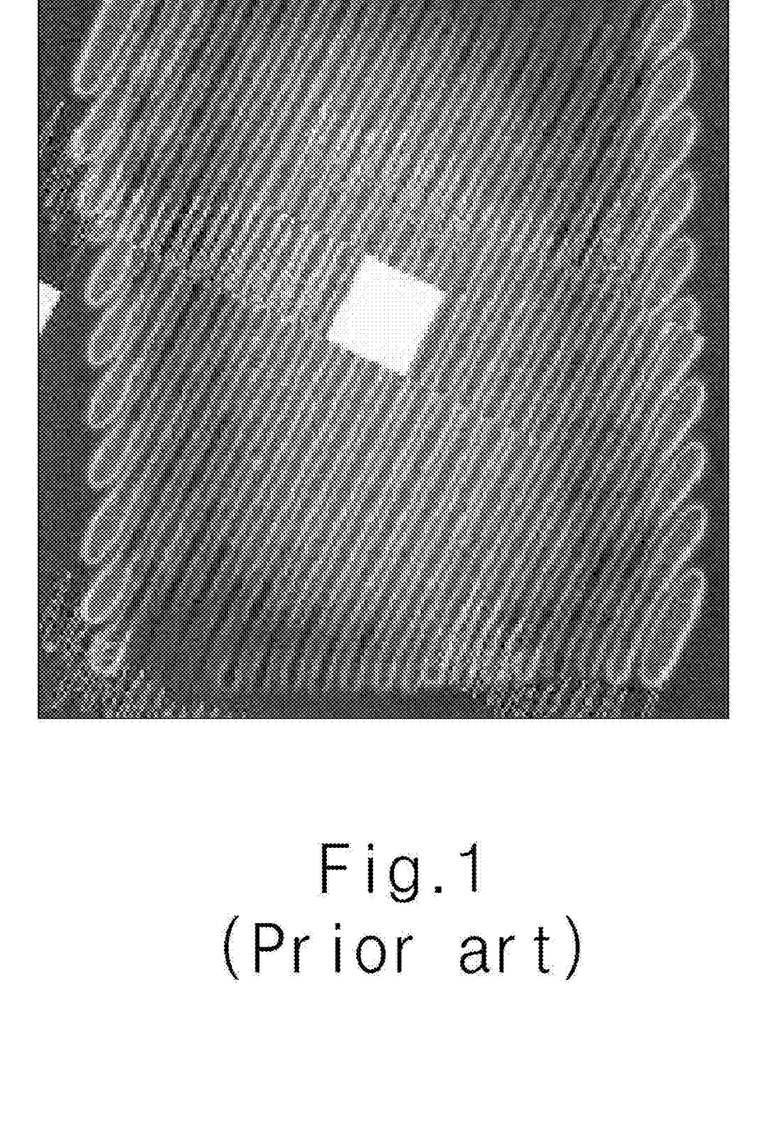
FIGS. 1 and 2 are a plane photo and a plane view illustrating a method for forming a semiconductor device using a conventional exposure mask.
Figure 2:
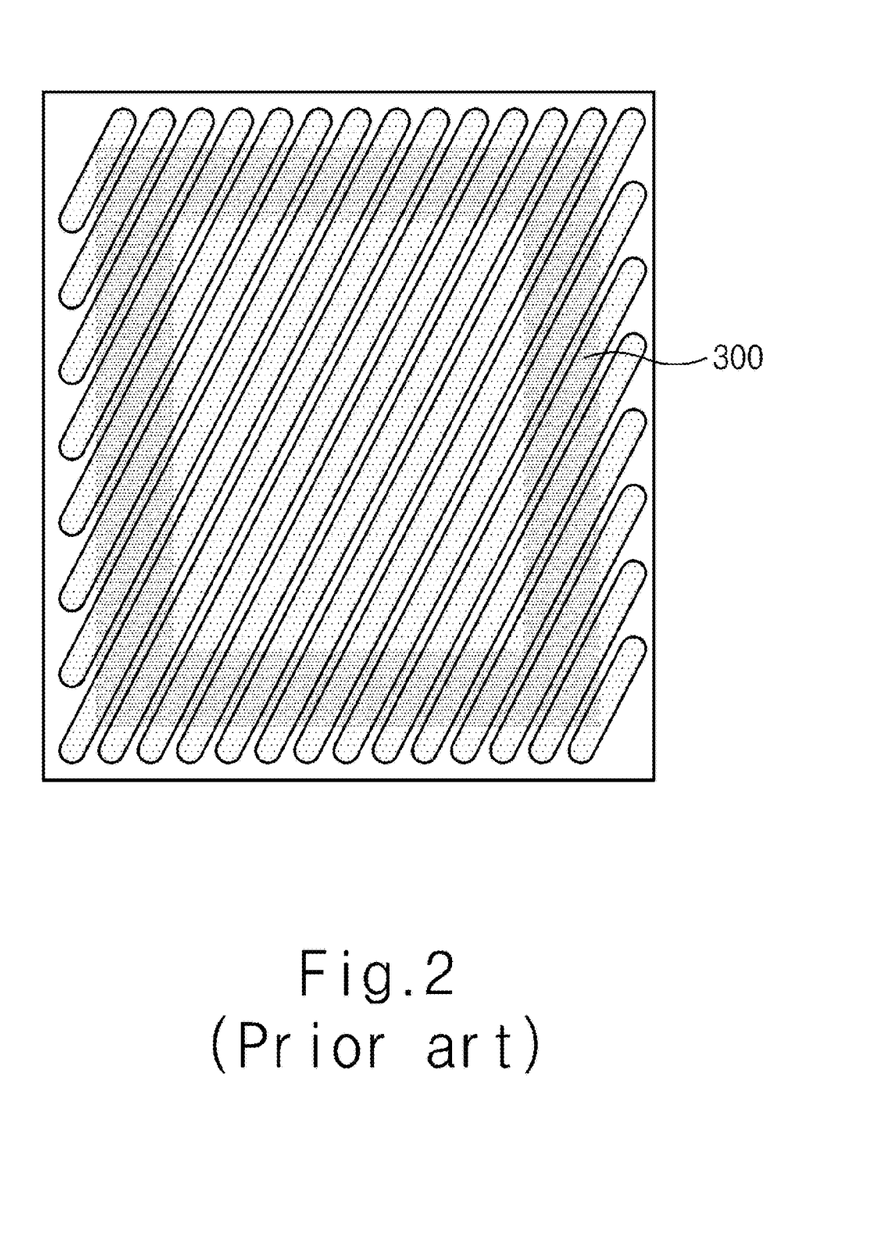

FIGS. 1 and 2 are a photo and plan view illustrating a method for forming a semiconductor device employing a 6F2 structure using a conventional exposure mask.

FIG. 1 is a photo showing a photo resist pattern formed on a target semiconductor substrate by using an exposure mask in which the OPC pattern and the assistant pattern are formed at four corners of a cell configured of a quadrangle structure.

According to a conventional exposure mask, a light blocking pattern is formed to define a cell region in a line shape, and an assistant pattern is formed on the outer side of the cell region.

The assistant pattern is formed on the exposure mask, but is not transferred onto a target semiconductor substrate.

The light blocking pattern is formed on a quartz substrate. The OPC is individually performed location by location and the patterning is performed by a lithographic process.

An assistant pattern is formed of a plurality of line patterns. The distance between the light blocking patterns is not uniform, and the distance between the light blocking pattern and the assistant pattern is not uniform, either.

This is because OPC is made differently depending on the location of the light blocking patterns. Thus, the size of a plurality of rectangular patterns is not uniformly formed.

Referring to FIG. 1, a hard mask layer is formed on the target semiconductor substrate and a photo resist is coated on the substrate. Then, the photo resist pattern is formed by an exposure and development process using the conventional exposure mask mentioned above. The photo resist pattern is formed in a sloped shape like the light blocking pattern on the exposure mask.

A scum is formed on the sidewalls of the photo resist patterns along four sides of the cell region.

In a subsequent process, the photo resist pattern is used as a mask to pattern the hard mask layer. If a scum remains, the hard mask layer cannot be patterned as desired, and thus, an active region also cannot be defined as desired.

Then, the hard mask layer is patterned using the photo resist pattern so that the hard mask layer is left only over the active region.

A trench for isolation is formed by etching the target semiconductor substrate using the hard mask pattern as an etching mask and an isolation film is formed by filling the trench with insulating material.

FIG. 2 is a plan view which simplifies and illustrates the photograph of FIG. 1.

The same problem is found when an island type pattern is formed using a conventional exposure mask.

As described above, it is hard to properly pattern the photo resist pattern located on cell edge side due to a scum even if an OPC process is employed.

BRIEF SUMMARY OF THE INVENTION

Various embodiments of the invention are directed to provide an exposure mask which can be applied to the high integration of semiconductor device without OPC and a method for forming a semiconductor device using the same.

According to an embodiment of the present invention, an exposure mask comprises: light blocking patterns in which a pattern which is identical with a cell region is extended to the outer side from the cell region.

Preferably, the light blocking patterns are line-shaped, the light blocking patterns partly have a different line width according to density and line width of a micro-pattern formed in the cell region on wafer, and the light blocking patterns are formed with a width of 0.5-100 μm into the outer side of the cell region.

According to a first aspect of the present invention, a method for manufacturing a semiconductor device comprises: forming a hard mask layer on wafer; forming a hard mask layer pattern by using an exposure mask including light blocking patterns in which a pattern which is identical with a cell region is extended to the outer side from the cell region; and cutting the hard mask layer pattern by a photolithographic etching process using an exposure mask for cutting.

Preferably, the exposure mask for cutting is designed to have a bar-shaped light transmission region, which is configured to pattern the line-shaped pattern in the cell region into a bar-shaped pattern. In an exposure process, the exposure mask for cutting may be located at such a position that the other region corresponds to a light transmission region of the exposure mask for cutting when, for example, a positive photoresist is employed in the exposure process. Alternatively, in an exposure process, the exposure mask for cutting may be located at such a position that the other region is corresponds to a light blocking region of the exposure mask for cutting when, for example, a negative photoresist is employed in the exposure process.

According to a second aspect of the present invention, a method for manufacturing a semiconductor device comprises: forming a hard mask layer on wafer; forming a hard mask layer pattern by using an exposure mask including light blocking patterns in which a pattern which is identical with a cell region is extended to the outer side from the cell region; forming a spacer on the side wall of the hard mask layer pattern; removing the hard mask layer pattern; and forming a space pattern by a photolithographic etching process using an exposure mask for cutting.

Preferably, the hard mask layer and the spacer have a difference etch selectivity. The method for manufacturing a semiconductor device according to a second aspect of the present invention further comprises etching the wafer with the first hard mask layer pattern as an etching mask.

In the meantime, the technical principle of the present invention is as follows. The present invention has the shape and process margin which are identical with a cell and can implement the scheduled pattern on a wafer by constituting a region excepting cell formed with patterns having different forms and environments with patterns formed in the cell, that is, the outer side of cell, into the same shape as a cell.

That is, as usual, regions having different environments with cells exist. However, in the design of the present invention, regions different with cells are formed with a shape identical with the cell such that the scheduled pattern can be formed without a special OPC work.

DESCRIPTION OF EMBODIMENTS

Hereinafter, the present invention will be illustrated in detail with reference to the attached drawings.

Figure 3:
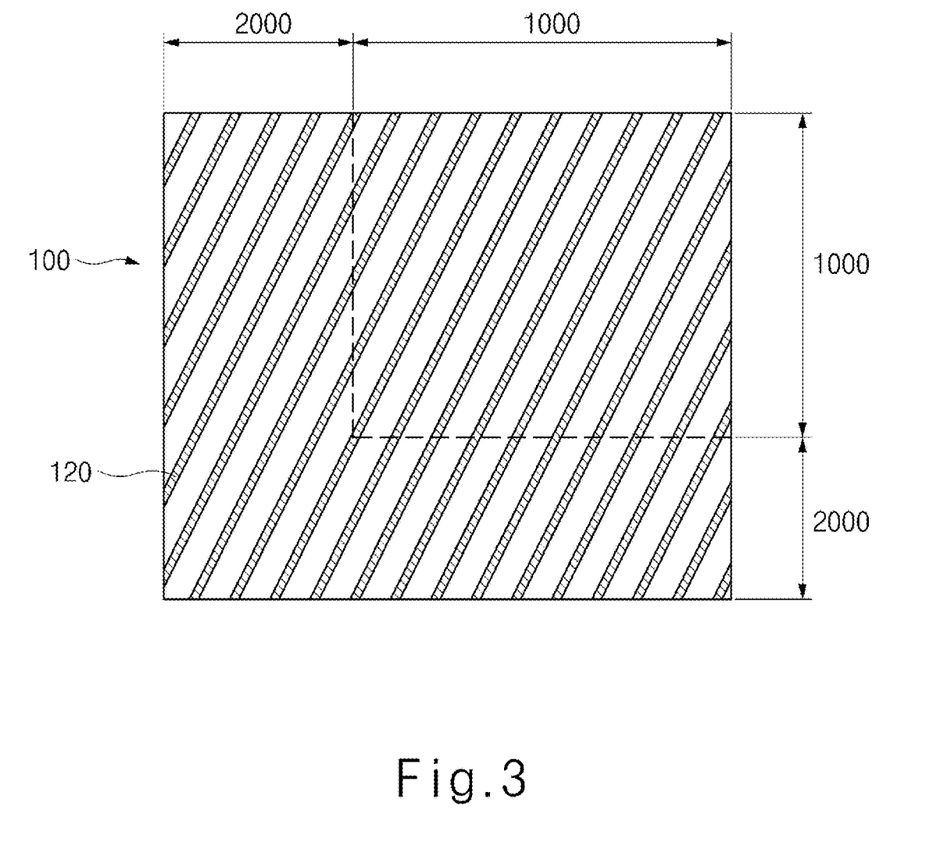
FIGS. 3 to 5 are a plane photo and a plane view illustrating an exposure mask according to an embodiment of the present invention and a method for forming a semiconductor device using the same.
Figure 4:
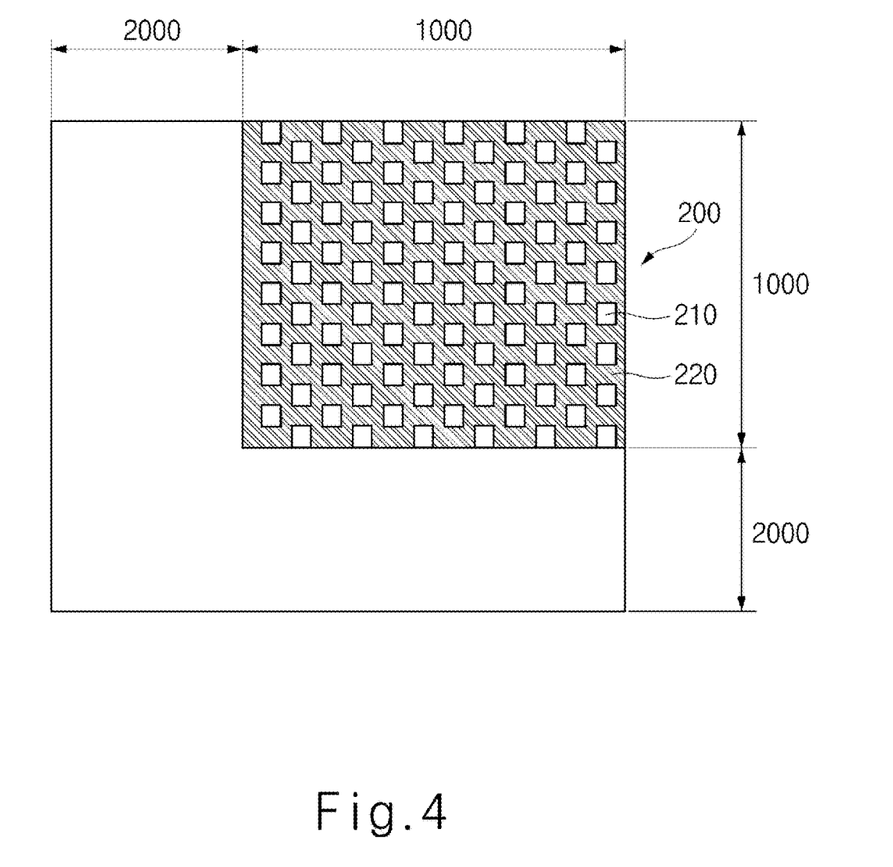

FIGS. 3 and 4 are a plane view illustrating an exposure mask according to an embodiment of the present invention, illustrating the 6F2 cell structure. At this time, for convenience, a cell region 1000 and an other region 2000 are identically described in FIGS. 3 and 4.

Of course, like the 4F2 structure, the present invention can be applied to a cell structure in a 6F2 size or less, or can be applied to a cell structure in a 6F2 size or more.

FIG. 3 is an exposure mask 100 capable of forming a light blocking pattern 120 of line-shape, which forms a line pattern on the whole surface of wafer including the cell region 1000 and a region 2000 (hereinafter, "other region") positioned in the outer side of cell region 1000. Here, FIG. 3 illustrates an end portion of one side of the cell region 1000 and the other region 2000 which is adjacent to that.

At this time, the light blocking pattern 120 of line-shape is formed in an active region (not shown) with a sloped shape. Of course, it can be formed to be horizontal or vertical with the active region if design and process margin approve.

Here, the light blocking pattern 120 in the other region 2000 should have the width of 0.5-100 μm from the cell region 1000.

According to the pattern size and the pattern density which is formed in the cell region 1000, the light blocking region 120 of line-shape can be formed with different sizes of line and space pattern.

FIG. 4 is an exposure mask 200 which cuts a line pattern (not shown) formed in the cell region of wafer by using the exposure mask 100 of FIG. 3 and is designed to remove the line pattern formed in the other region (refer to '2000' of FIG. 3), which can be formed with a different polarity of light blocking region and transmission region according to the use of negative type photo resist or positive type photo resist. Here, it is exemplified that positive type photo resist is used.

Referring to FIG. 4, in the exposure mask 200, a light blocking pattern 220 which defines a light transmission region 210 of dot type isolated with a given distance on the light blocking pattern ('120' of FIG. 3) in order to form a plurality of bar types by cutting the light blocking pattern ('120' of FIG. 3) of line-shape on the cell region ('1000' of FIG. 3).

At this time, the light transmission region 210 is formed in such a manner that the other region ('2000' of FIG. 3) is all exposed and, if necessary, the light blocking pattern can be formed in the other region ('2000' of FIG. 3).

In the meantime, in case of using a negative photo resist, the light blocking region and the light transmission region can be interchanged to be formed.

FIG. 5a to 5e is a plane view illustrating a method for forming a semiconductor device using an exposure mask according to the present invention, illustrating the end of a part of wafer which is divided into a cell region 3000 and an other region 4000.

For your reference, a method for patterning using a hard mask layer can be classified into a method of using only one hard mask layer or a method of using two hard mask layers. FIGS. 5a to 5e illustrate a method for using two hard mask layers.

Figure 5A:
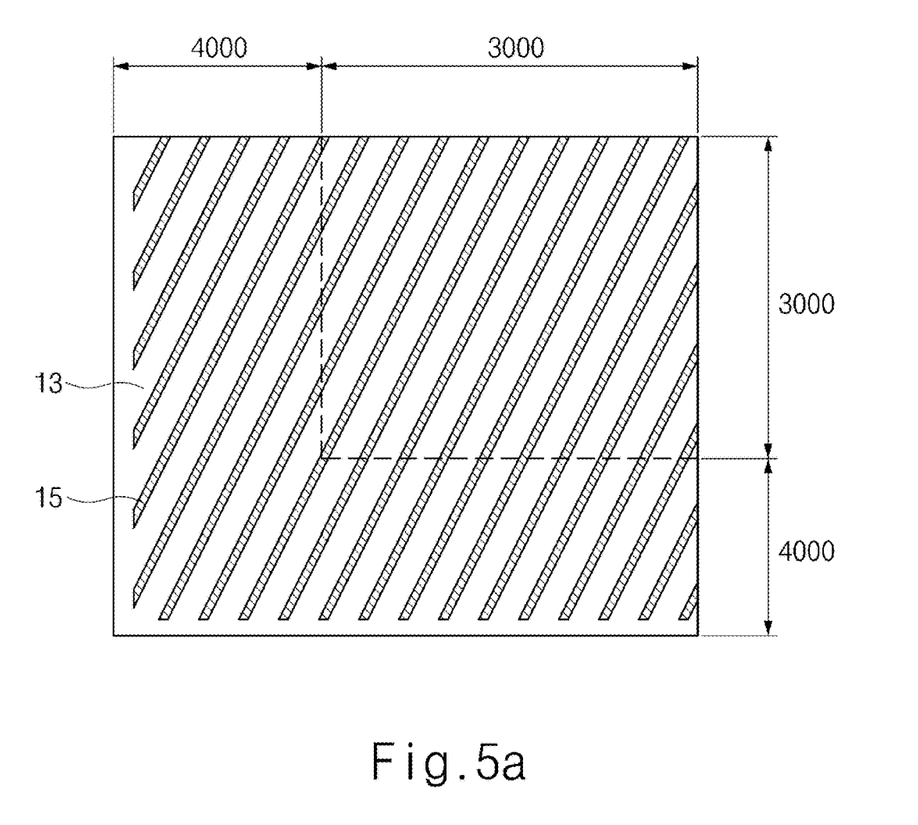

Referring to FIG. 5a, a first hard mask layer 13 and a second hard mask layer 15 are successively laminated on a wafer (not shown).

At this time, the first and second hard mask layers 13, 15 are respectively formed with an insulating layer such as oxide layer, nitride layer or nitride oxide layer. The first hard mask layer 13 and the second hard mask layer 15 are formed with a material having a different etch selectivity.

Then, the first hard mask layer 13 pattern is formed with a photolithographic etching process using the exposure mask 100 of FIG. 3.

At this time, the photolithographic etching process using the exposure mask 100 of FIG. 3 is as follows.

1. A photo resist is coated on the upper portion of the second hard mask layer 15.

2. A photo resist pattern (not shown) is formed by the exposure and development process using the exposure mask 100 of FIG. 3.

At this time, the photo resist pattern is formed with the active region and the sloped line pattern.

3. The second hard mask layer 15 is etched with a photo resist pattern as a mask, and the second hard mask layer 15 pattern is formed by removing the photo resist pattern.

Here, the first hard mask layer 15 pattern is formed on the whole surface of wafer with a line-shape through the cell region 3000 and the other region 4000 like the light blocking pattern 120 formed in the exposure mask 100 of FIG. 3.

Figure 5B:
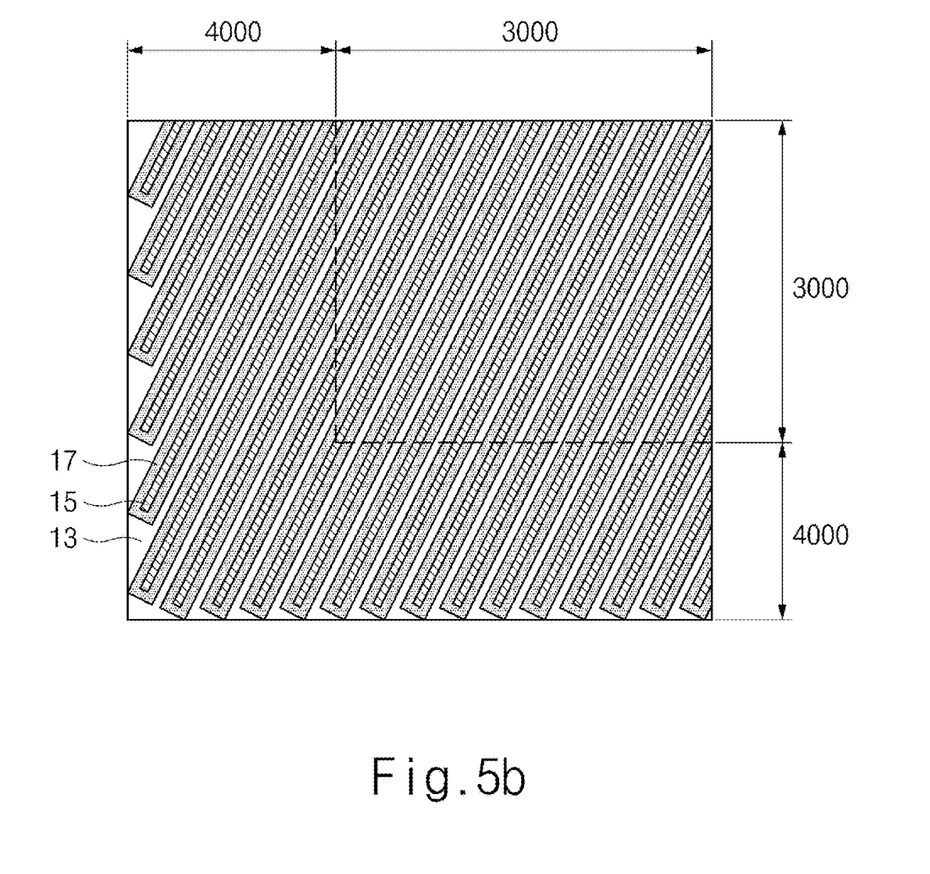

Referring to FIG. 5b, a spacer 17 is formed on the side wall of the second hard mask layer 15.

At this time, a spacer material is deposited on the upper portion of the whole surface and this is anisotropically etched to form the spacer 17. In a subsequent process, an underlying layer pattern having a scheduled size is formed by etching the underlying layer with the spacer 17 as an etching mask. For your reference, the spacer material is formed with an insulating material having a different etch selectivity than the second hardmask layer 15 pattern.

Here, the process of FIG. 5b is performed when forming a micro-pattern according to the high integration of semiconductor device. It is named as the SPT (spacer patterning tech.), and in some cases, can form the underlying layer pattern by using the DPT (double patterning tech.).

Of course, the underlying layer pattern can be formed by forming only one hard mask layer on the wafer without SPT or DPT and by using only the process of FIG. 5a using the exposure mask.

Figure 5C:
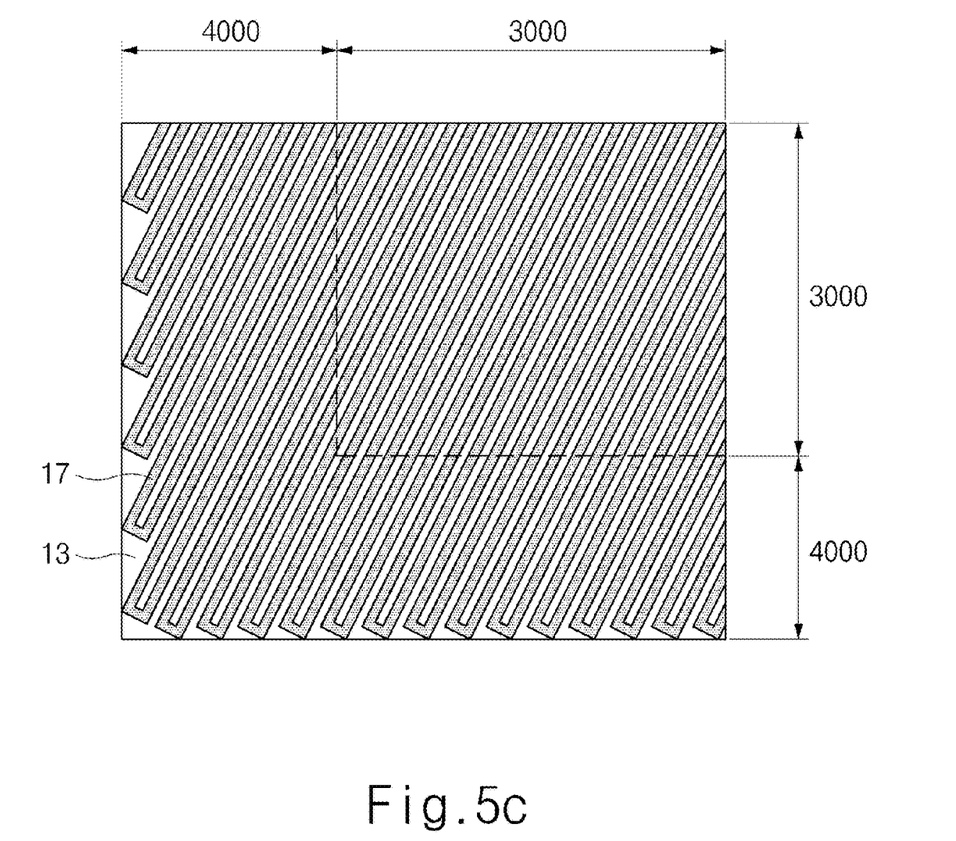

Referring to FIG. 5c, the second hard mask layer 15 pattern of FIG. 5b is removed. At this time, the second hard mask layer 15 pattern is removed by using the difference of etch selectivity between the spacer 17 and the first hard mask layer 13.

Figure 5D:
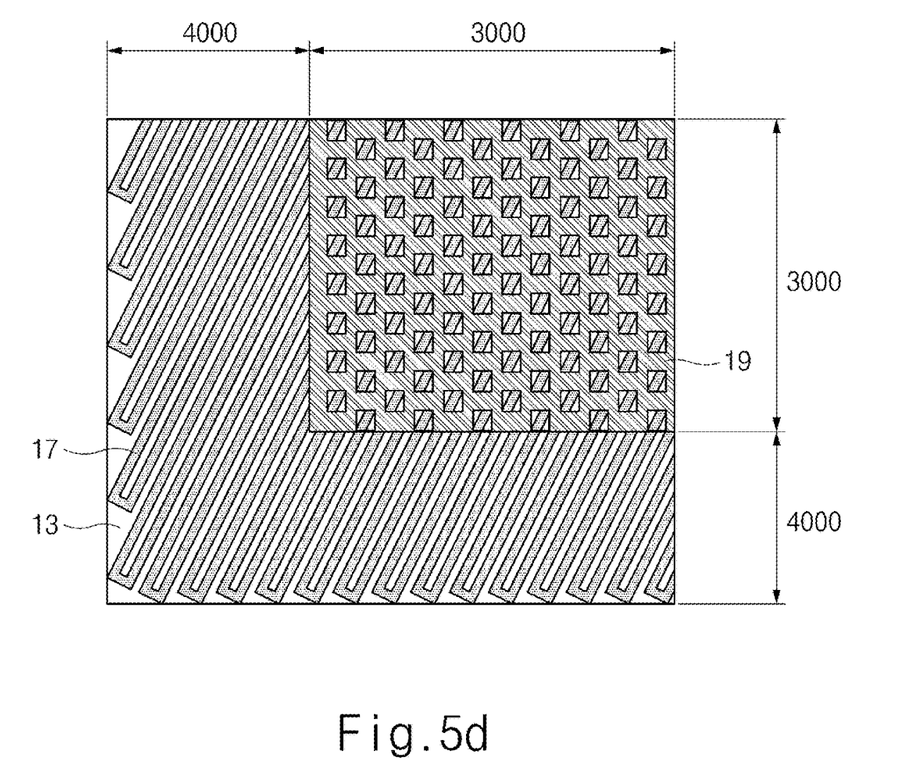
Figure 5E:
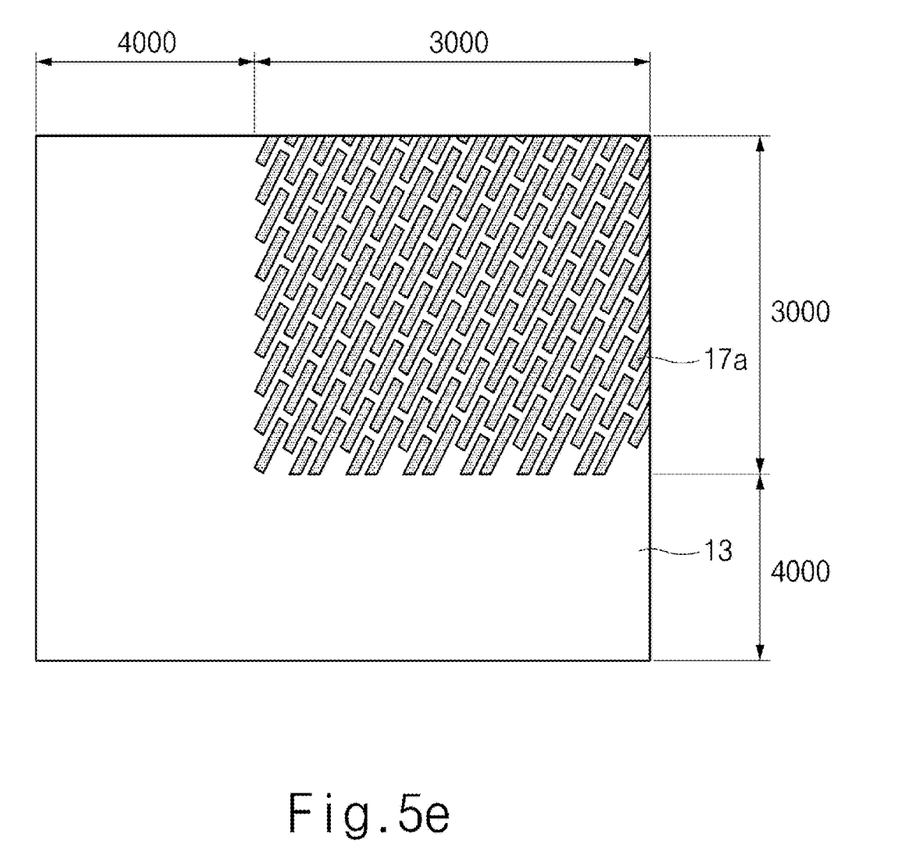

Referring to FIGS. 5d and 5e, the spacer 17 is etched by the photolithographic etching process using the exposure mask 200 of FIG. 4 and the spacer pattern 17a is formed. At this time, the exposure mask 200 of FIG. 4 is an exposure mask for cutting, playing the role of performing the patterning with a bar type by cutting the spacer 17 of line-shape in the cell region 3000.

Here, the photolithographic etching process using the exposure mask 200 of FIG. 4 will be illustrated.

1. A photo resist is coated on the upper portion of the whole surface.

2. A photo resist pattern 19 is formed with the exposure and development process using the exposure mask 200 of FIG. 4.

3. The spacer pattern 17a is formed by etching the spacer 17 with the photo resist pattern 19 as an etching mask. At this time, the spacer 17 positioned in the other region 4000 is completely removed.

4. The photo resist pattern 19 is removed when it is remained.

Accordingly, the spacer pattern 17a is formed to be separated with a given distance with a sloped bar type.

For your reference, in the cutting of the spacer 17 using the exposure mask 200 of FIG. 4, that is, in the patterning process of the spacer 17, the design of the exposure mask 200 for cutting is changed depending on the selection among the negative photo resist and the positive photo resist.

In another embodiment of the present invention, the exposure mask 200 of FIG. 4 a, that is, the exposure mask for cutting is designed to play the role of performing the cutting in the cell region ('1000' of FIG. 3) while pattern is remained in the other region ('2000' of FIG. 3).

Still another embodiment of the present invention can be applied to an exposure mask of all parts in which the pattern of island shape or line-shape is formed in the process of forming a semiconductor device, and can be applied to a method for forming a semiconductor device which enables to form the pattern of island shape or line-shape on the semiconductor substrate depending on the availability of the exposure mask for cutting according to the usage of the exposure mask.

As described above, an exposure mask according to the present invention and a method for forming a semiconductor device using the same provides an exposure mask which enables to form an underlying layer pattern without OPC with a scheduled size to improve the characteristic of the semiconductor device, the reliability and the yield such that the high integration of the semiconductor device can be accomplished.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory DRAM device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming a substrate including a cell region and an outside region, wherein the outside region is adjacent to the cell region;
    performing a first exposure process using a first exposure mask to form a main line-shaped pattern over the substrate in the cell region and to form an assistant line-shaped pattern over the substrate in the outside region, wherein the assistant line-shaped pattern extends from the main line-shaped pattern and has substantially the same shape and size as the main line-shaped pattern; and
    performing a second exposure process using a second exposure mask to pattern the main line-shaped pattern into a bar pattern while removing the assistant line-shaped pattern.

2. The method according to claim 1, wherein the first exposure process is performed without an Optical Proximity Correction (OPC) implementation.

3. The method according to claim 1, wherein the second exposure process is performed without an Optical Proximity Correction (OPC) implementation.

4. The method according to claim 1, wherein the first exposure mask includes a line-shaped light-transmission pattern, and
    wherein the second exposure mask includes a bar-shaped light-transmission pattern.

5. The method according to claim 1, wherein the first exposure process includes performing a spacer patterning technology (SPT), the SPT comprising:
    forming a line-shaped sacrificial pattern using the first exposure mask over the substrate, wherein the line-shaped sacrificial pattern extends from the cell region to the outside region;
    forming spacers over sidewalls of the line-shaped sacrificial pattern; and
    removing the line-shaped sacrificial pattern to form a line-shaped spacer pattern,
    wherein the line-shaped spacer pattern in the cell region forms the main line-shaped pattern, and the line-shaped spacer pattern in the outside region forms the assistant line-shaped pattern.

6. The method according to claim 1, wherein the first exposure process includes performing a double pattern technology (DPT), the DPT comprising:
    providing an underlying layer over the substrate in the cell region and the outside region;
    forming a first line-shaped etching mask pattern using the first exposure mask over the substrate, wherein the first line-shaped etching mask pattern extends from the cell region to the outside region; and forming a second line-shaped etching mask pattern using the first exposure mask over the substrate so that the second line-shaped etching mask pattern is formed between neighboring first line-shaped etching mask patterns, wherein the second line-shaped mask pattern extends from the cell region to the outside region; and patterning the underlying layer using the first and the second line-shaped etching mask patterns to form an underlying layer pattern, wherein the underlying layer pattern in the cell region forms the main line-shaped pattern and the underlying layer pattern in the outside region forms the assistant line-shaped pattern.

7. The method according to claim 1, wherein the semiconductor device has a 6F2 configuration.

* * * * *